Figure 1:
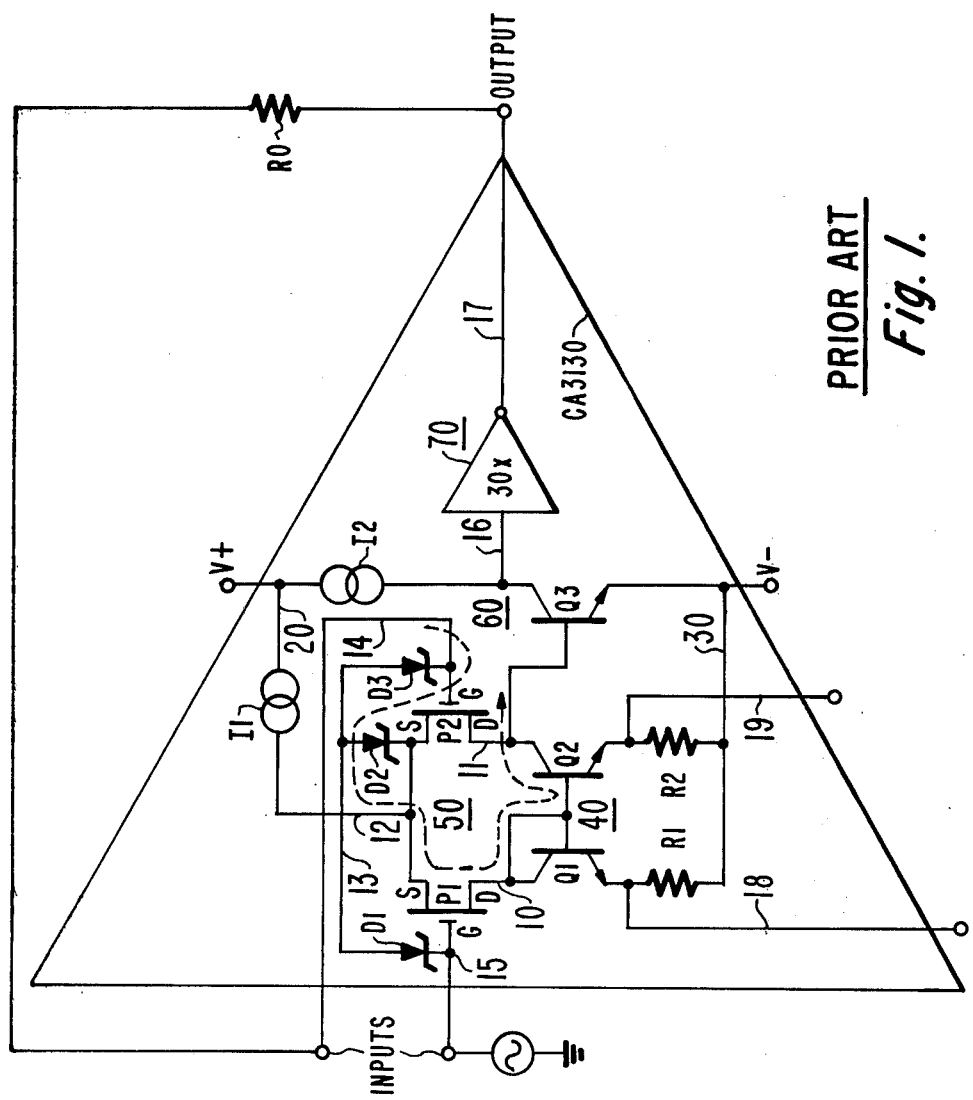

United States Patent [19]

Schade, Jr.

[11] 4,158,178

[45] Jun. 12, 1979

[54] ANTI-LATCH CIRCUIT FOR AMPLIFIER STAGE INCLUDING BIPOLAR AND FIELD-EFFECT TRANSISTORS

[75] Inventor: Otto H. Schade, Jr., North Caldwell, N.J.

[73] Assignee: RCA Corporation, New York, N.Y.

[21] Appl. No.: 906,005

[22] Filed: May 15, 1978

[51] Int. Cl.$^2$ .............................................. H03F 3/45
[52] U.S. Cl. ...................................... 330/253; 323/4; 330/257; 330/277; 330/288; 361/91
[58] Field of Search .................. 323/4; 330/253, 257, 330/288, 277; 361/91

[56] References Cited

U.S. PATENT DOCUMENTS

| | | | |
|---|---|---|---|
| 3,819,952 | 6/1974 | Enomoto et al. | 361/91 X |
| 3,852,679 | 12/1974 | Schade, Jr. | 330/257 |
| 3,879,640 | 4/1975 | Schade, Jr. | 361/91 |
| 4,078,199 | 3/1978 | Chapron et al. | 323/4 X |

Primary Examiner—Lawrence J. Dahl
Attorney, Agent, or Firm—H. Christoffersen; A. L. Limberg; E. P. Herrmann

[57] ABSTRACT

A circuit for preventing latch up of a differential-input stage, which includes both bipolar and field-effect transistors, without degrading performance including means for clamping the base electrode of the slave transistor of a current mirror whenever the potential thereacross approaches a level sufficient to forward bias the base collector junction thereof to forestall its reaching such level.

8 Claims, 4 Drawing Figures

ANTI-LATCH CIRCUIT FOR AMPLIFIER STAGE INCLUDING BIPOLAR AND FIELD-EFFECT TRANSISTORS

This invention relates to amplifier circuitry including field effect transistors having input gate protection and bipolar transistors in an ensuing current mirror amplifier configuration having a tendency to "latch up" into a constant dc state under certain operating conditions.

A relatively new and evolving integrated circuit technology called BiMOS combines bipolar transistor technology with the metal-oxide-semiconductor (MOS) transistor technology on the same monolithic die. Incorporation of both types of devices on a monolithic die permits the design of circuit which can take advantage of the more desirable aspects of both technologies. For example, in the design of an operational amplifier, it is desirable to achieve high input impedance, wide bandwidth, high gain and a wide dynamic output voltage range. The high input impedance and dynamic output voltage range are more readily realized with MOS circuitry while the gain and bandwidth requirements are more readily realized with bipolar circuits. A family of BiMOS devices is commercially available from RCA Corporation, pioneer in BiMOS technology.

Some BiMOS amplifiers are designed with a differential input stage having a pair of MOS transistors connected in long-tailed pair configuration with their sources interconnected to receive a tail current and with their drain electrodes respectively connected to the input and output connections of a bipolar current mirror formed with emitter degeneration resistors, which serves both as a load and a means for converting from a balanced to single ended output. Such differential input stages are described in U.S. Pat. No. 3,852,679 issued Dec. 3, 1974 to Otto Schade, Jr. entitled "Current Mirror Amplifiers." In such a differential input stage, the input signals are generally applied to the gate electrodes of the MOS devices. The gate electrodes of MOS transistors, however, are extremely vulnerable to the build up of static charge. The gate electrode effectively forms a capacitor structure wherein the gate electrode and the semiconductor material are opposing capacitor plates separated by an extremely thin dielectric material e.g., 1,000 Å $SiO_2$. The impedance presented by the gate electrode is inherently very high, allowing the possible build up of relatively high levels of static charge, to the point where the potential generated between the capacitor plates is sufficient to cause destructive breakdown of the dielectric and permanently damage the particular MOS transistor.

To prevent such breakdown, a protection diode is included between the gate and source electrodes to limit the maximum gate to source potential attainable, to the available breakdown potential of the protection diode (e.g., approximately 8 volts). Protection diodes of the type used are described in U.S. Pat. No. 3,879,640, issued Apr. 22, 1975 to Otto Schade, Jr., entitled "Protective Diode Network for MOS Devices." The consequence of this, however, is that when avalanche breakdown of the protection diode occurs, current flows from the gate electrode to the common source interconnection of the MOS differential transistor pair. This current adds to the tail current, which is designed to optimize the operation of the amplifier stage and may be relatively small. Under certain conditions, this combined current may be diverted by the differential action of the amplifier to one leg of the amplifier and overload the bipolar current mirror load circuit, producing an anomalous output. If the potential causing avalanche breakdown of the protection diode is produced by a closed-loop feedback circuit, the amplifier has been found sometimes to "latch up." That is, it goes into a state in which the output assumes a constant dc voltage from which state it cannot be extricated without momentarily removing the operating voltages.

The particular operational failure is a result of the excess current flowing through the current-mirror load circuit when the tail current is augmented by avalanche current flowing through the protection diode. The current mirror used in this type of amplifier is designed with degeneration resistors in the emitter circuits of both the master and slave mirroring transistors. When sufficient current flows through the master mirroring transistor, and its respective degeneration resistor, the control voltage generated at its base electrode may exceed $2V_{BE}$ i.e., twice the base-emitter forward biased junction potential. Simultaneously the collector potential of the slave mirroring transistor would normally be decreasing. This combination of events can cause the base-collector junction of the slave mirroring transistor to become forward biased and erroneously supply drive current to subsequent circuits. In normal operation, this type of anomalous behavior does not occur. Only when the circuit is biased with relatively large supply potentials and a relatively large percentage of feedback potential is applied to the imput in the one instance or when a relatively large external potential is applied to the input gate electrode in a second instance will the overload condition occur.

The invention is embodied in the improvement of an amplifier as previously described to include means for clamping the base electrode of the slave mirroring transistor whenever the potential thereat approaches a level sufficient to forward bias the base collector junction of said transistor to forestall its reaching that level.

Figure 4:
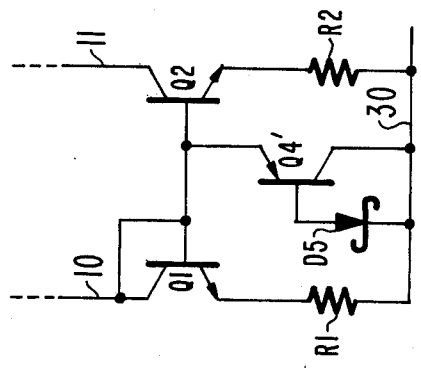
Figure 3:
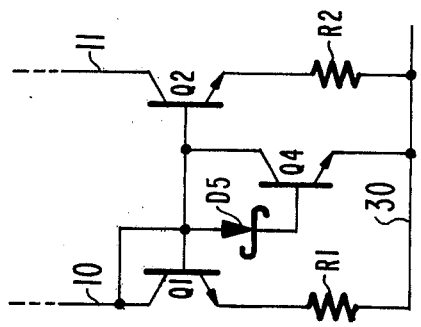
Figure 2:
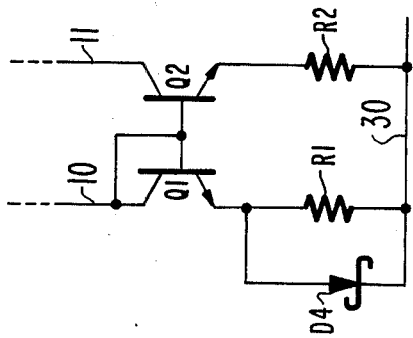

FIG. 1 is a partial schematic of a prior art operational amplifier fabricated in a combined bipolar-MOS integrated circuit technology, used for illustrating the problem described by the present invention;

FIG. 2 is a schematic diagram of a modification to be made to the FIG. 1 amplifier so it embodies the present invention, wherein a Schottky diode is placed in parallel connection with the resistor R1; and Each of FIGS. 3 and 4 is a schematic diagram of an alternative modification to be made to the FIG. 1 amplifier so it embodies the present invention, wherein a combination of a Schottky diode and transistor shunts the control electrodes of the load transistors of the differential circuit.

Referring to FIG. 1, metal-oxide-semiconductor (MOS) transistors P1 and P2 are connected to form a differential-input long-tailed pair 50, their source electrodes being connected together to receive tail current from current source I1. Bipolar transistors Q1 and Q2 arranged as a current mirror 40 with degeneration resistors R1 and R2 in their emitter circuits respectively operate as current source loads to the drain circuits of long-tailed pair 50. Long-tailed pair 50 and current mirror load means 40 in combination form a differential-input stage for the operational amplifier which is of a type exemplified by the CA3130 presently manufactured by RCA Corporation. Current source I1 provides tail current to the long-tailed pair 50 which is regulated to a value that will insure linear operation of the circuit over dynamic range.

Transistor Q3 combined with a constant-current-generator collector load provided by current source I2 form a second gain stage 60 which receives its drive from the differential-input amplifier input stage, and drives subsequent inverting gain stages 70.

Diodes D1 and D3 connected between terminal 15 and 13 and terminals 14 and 13 respectively, are reverse biased for normal circuit operation, but will avalanche to provide gate-semiconductor overvoltage protection. Diode D2 connected between terminals 13 and 12 is normally forward biased. For this discussion, D2 can be assumed to be a short circuit so that D1 is effectively between gate terminal 15 and source terminal 12 and D3 is effectively between gate terminal 14 and source terminal 12.

Input potentials to the amplifier are applied to terminals 14 and 15. If the potential applied to either 14 or 15 is such that the potential between 14 or 15 and 12 exceeds its avalanche breakdown potential, the respective diode D3 or D1 will avalanche to conduct a current from the relevant gate electrode to terminal 12, which current will add to the tail current supplied by I1.

MOS transistors P1 and P2 are p-channel enhancement devices having source electrodes interconnected at terminal 12 having gate electrodes connected to terminals 15 and 14 respectively for receiving input potentials and having drain electrodes connected respectively to the input 10 and output 11 terminals of current mirror 40. MOS devices conduct current between their source and drain electrodes responsive to the potential applied between their gate and source electrodes. P-channel enhancement devices conduct more heavily as their gate potentials are made more negative with respect to their source potentials and tend to cease conducting when the gate-to-source potential approaches zero volts. In the particular circuit of FIG. 1, tail current I1 is supplied to the tail connection 12, between the source electrodes P1 or P2 which current then divides between the source-drain conduction paths of P1 and P2 in direct proportion to their relative gate-to-source potentials. Alternatively, the more positive the gate potential of either MOS transistor with respect to the other, the less the amount of current that flows in that respective transistor. Consequently, if terminal 14 is sufficiently positive to cause avalanche breakdown of diode D3 and inject current to terminal 12, and simultaneously sufficiently positive to turn off P2 while P1 remains conducting, the sum total of the tail current supplied from current source I1 plus the current injected by D3 will flow between the source and drain of P1 to terminal 10. Conversely, if terminal 15 is of like positive potential while P2 remains conducting, the total current will flow into terminal 11.

The load means for the MOS differential transistor pair comprises bipolar current mirror 40 with degeneration resistors R1 and R2. Transistor Q1 which has its base and collector electrodes connected to terminal 10 is designated the master mirroring transistor. Transistor Q2, with its collector connected to the drain electrode of P2 at terminal 11 and with its base electrode connected to the base electrode of Q1, is designated the slave mirroring transistor.

Current flows from the drain electrode of P1 into terminal 10 to whch the base and collector electrodes of Q1 are connected. A portion of this current flowing through the base-emitter junction Q1 causes the collector-emitter conduction path of Q1 to pass current. The combined collector and base currents flowing through the emitter of Q1 generate a base-emitter junction potential $V_{BE}$ commensurate with that required to pass the current supplied from the drain of P1. This current subsequently flows from the emitter electrode of Q1 through resistor R1 and generates a potential $V_{R1}$. Transistor Q2 has its base electrode connected to the base electrode of Q1 and has resistor R2 similar to R1 connected between its emitter electrode and terminal 30. The potential $V_{BE}+V_{R1}$, generated by the current conducted by Q1 and established between the base of Q1 and terminal 30, appears as a control potential across the similar base-emitter circuit of Q2 and causes a collector current to flow through Q2 similar to the collector current in Q1. Current mirrors need not employ degeneration resistors and dispensing with the resistors would cure the latch up problem. However, degeneration resistors R1 and R2 are required in this amplifier circuit to provide a means for nulling out inherent input offset parameters and also as a means of limiting the electrical noise of Q1 and Q2 reflected back to the amplifier inputs. In normal operation, the maximum emitter current of Q1 or Q2 is limited to the tail current supplied from current source I1 and is of such value that $V_{R1}+V_{BE}$max., the potential between 10 and 30, is less than $2V_{BE}$. The maximum potential that can be sustained at the collector of Q2, that is between 11 and 30 is one $V_{BE}$, due to the clamping action of the base-emitter junction of transistor Q3 which is cascaded with Q2 to provide added amplification. The potential required to forward bias a base-collector junction is essentially one $V_{BE}$. Therefore, when the current through Q1 is sufficient to generate a control potential at the base of Q2 in excess of $2V_{BE}$, the base-collector junction of Q2 will become sufficiently forward biased to supply substantial base bias current to Q3. Normally, as the current through Q1 increases, the potential at 11 decreases, tending to deny Q3 of base drive. When excessive current flows in Q1, however, the opposite condition occurs. Current pours through the then forward-biased collector-base junction of Q2 tending to increase the base drive applied to Q3; the resulting conduction of Q3 produces an anomolous output.

An amplifier of this type with direct-coupled closed-loop feedback—e.g., as provided by a feedback resistor $R_O$ connecting its output and inverting input as shown in FIG. 1—may latch up in a d.c. state. This happens if output 17 achieves a sufficiently positive potential to cause avalanche breakdown of D3, and R0 is not sufficiently large to limit the current caused to flow between 14 and 12 and subsequently through R1, following the route indicated by dashed arrow on FIG. 1. If this current causes the voltage across R1 to exceed $1V_{BE}$, the base-collector junction of Q2 is forward biased and a portion of the current following the route indicated by the dashed arrow, drives the base of Q3 which in conjunction with 70 drives the output 17 more positive, creating still more excess current until 17 reaches its maximum positive potential.

The potential between 10 and 30, equal to $V_{BE}+V_{R1}$ must be prevented from either equaling or exceeding the $2V_{BE}$ necessary to forward bias the base-collector junction of Q2 or latch up will occur. This may be done, for example, by limiting the potential drop $V_{R1}$ appearing across resistor R1 to an amplitude less than one $V_{BE}$ of the bipolar transistors in the circuit. More particularly, connecting a diode in shunt with R1 will achieve such a result.

FIG. 2 shows one such connection wherein diode D4 having its anode and cathode electrodes connected respectively to 18 and 30 has a forward biased potential drop less than the $V_{BE}$ of Q1. Typically integrated circuits are fabricated in silicon with resultant transistor $V_{BE}$ potentials of approximately 0.7 volt. A germanium pn diode having a forward potential drop of 0.3 volt or a silicon Schottky barrier diode which typically has a forward potential drop of 0.35 volt are examples of two types of devices which will sufficiently limit $V_{R1}$ to prevent latch up. These are external modifications to the integrated amplifier to prevent latch up. A Schottky barrier diode can be fabricated on the monolithic die, however the series resistance of a diode that can be practically integrated may be too high to provide sufficient limitin of the potential drop across R1.

A means of preventing latch up readily susceptible of integration is shown in FIG. 3. The potential on the base of Q2 is clamped by the series connection of the base-emitter junction of Q4 and the diode D5. The sum of the $V_{BE}$ of Q4 and the forward potential drop of D5 must be less than $2V_{BE}$. This can be achieved where diode D5 is a Schottky-barrier type of diode, for example, formed with a metal anode, such as aluminum, and an n-type silicon cathode to exhibit a forward offset voltage of approximately 0.3 volt, having its anode connected to terminal 10 and its cathode connected to the base of Q4. Current flowing in D5 is multiplied by the forward current gain of Q4 which has its collector and emitter electrodes connected to 10 and 30 respectively. When the potential at 10 is sufficient to bias D5 and Q4 into conduction, Q4 shunts the excess current from terminal 10, clamping the potential at 10 and preventing the base-collector junction of Q2 from forward biasing. The current multiplication by Q4 of the base drive provided by D5 circumvents the effects of high series resistance of D5 when D5 is an integrated Schottky-barrier diode.

While the invention has been particularly shown and described with reference to modifications of the CA3130 amplifier as constructed in BiMOS technology, the invention will be useful in similar amplifier configurations using both field effect and bipolar transistors, which may be constructed according to other technology combining field effect and bipolar transistors.

What I claim is:

1. In an electrical circuit having first and second insulated gate field effect transistors or FET's with respective drain and source and gate electrodes arranged in long-tailed pair configuration with means for applying input voltages to their gate electrodes and with a source of tail current connected to an interconnection of their source electrodes; means connected between the gate and source electrodes of at least one of said FET's for limiting the maximum potential that may be imposed on the gate electrode relative to the source electrode; first, second and third bipolar transistors of a first conductivity type with respective base and emitter and collector electrodes and with respective base-emitter junctions and base-collector junctions; first and second resistive means connected between a first terminal for application of an operating potential and the emitter electrodes of said first and second transistors respectively; means direct-coupling the collector electrode of said first transistor to an interconnection of the base electrodes of said first and second transistors, means connecting the collector electrodes of said first and second transistors to the drain electrodes of said first and second FET's respectively; means connecting the emitter electrode of said third transistor to said first terminal; means direct coupling the collector electrode of said second transistor to the base electrode of said third transistor; current source load means connected at the collector electrode of said third transistor; and voltage amplification means having its input connected at the collector electrode of said third transistor—the foregoing interconnections forming an amplifier circuit having a differential input and single-ended output, said amplifier circuit tending to latch up when operated with direct-coupled closed-loop feedback between said amplifier input and output connections when the potential at the gate electrode of said second FET is sufficient to cause said potential limiting means to conduct a current between the gate and source electrode of said second FET, said current flowing between the collector and emitter electrodes of said first transistor and through said first resistor generating a potential at the base electrode of said second transistor sufficient to forward bias the base-collector junction of said second transistor and provide current to drive the base electrode of said third transistor into saturation to give rise to the latch-up condition—the improvement for preventing said latch-up condition comprising:

means for clamping the base of said second transistor whenever the potential thereat approaches a level sufficient to forward bias the base-collector junction of said second transistor, to forestall its reaching that level.

2. Am amplifier circuit as defined in claim 1 wherein said means for clamping the base of said second transistor includes the base-emitter junction of said first bipolar transistor and further diode means, exhibiting a forward-biased offset potential which is less than the forward-bias, base-emitter junction potential of said first transistor, connected between the emitter electrode of said first bipolar transistor and said first terminal, and poled for tending to conduct simultaneously with the base-emitter junction of said first transistor.

3. An amplifier circuit as defined in claim 1 wherein said means for clamping the potential at the base of said second transistor comprises in combination a fourth bipolar transistor of saif first conductivity type and having base and emitter and collector electrodes and a base-emitter junction, the collector and emitter electrodes of said fourth transistor connected at the base electrode of said second transistor and at said first terminal respectively, diode means exhibiting a forward-biased pn junction potential which is less than the forward-biased, base-emitter junction potential of said first transistor connected between the base electrodes of said second and fourth transistors and poled for simultaneous conduction with the base-emitter junction of said fourth bipolar transistor.

4. An amplifier circuit as defined in claim 1 wherein said means for clamping the potential at the base of said second transistor comprises in combination a fourth bipolar transistor of a second conductivity type complementary to said first conductivity type and having base and emitter and collector electrodes and a base-emitter junction, the collector and emitter electrodes of said fourth transistor connected at said first terminal and at the base electrode of said second transistor respectively, diode means exhibiting a forward-biased offset potential which is less than the forward-biased, base-emitter junction potential of said first transistor connected between the base electrode of said fourth transistor and said first terminal and poled for simultaneous conduction with the base-emitter junction of said fourth bipolar transistor.

5. A current mirror comprising:

an input terminal;
an output terminal;
a common terminal;
first and second transistors of a first conductivity type, having respective collector and base and emitter electrodes; and respective collector-base and emitter-base junctions;
means connecting the respective collector electrodes of said first and second transistors respectively to said input and output terminals;
means connecting said input terminal to the base electrodes of said first and second transistors for applying respective base currents thereto;
first and second resistive means respectively connecting the emitter electrodes of said first and second transistors to said common terminal; and
means for forestalling any portion of input current received at said input terminal undesirably forward biasing the collector-base junction of said second transistor, including a means for limiting the potential excursion between said common terminal and the base electrode of said second transistor.

6. A current mirror as set forth in claim 5 wherein said means for limiting the potential excursion between said common terminal and the base electrode of said second transistor includes the emitter-base junction of said first transistor and a diode connected between the emitter electrode of said first transistor and said common terminal.

7. A current mirror as set forth in claim 5 wherein said means for limiting the potential excursion at the base electrode of said second transistor includes a third transistor of said first conductivity type having base and emitter and collector electrodes and having a base-emitter junction, the collector and emitter electrodes of said third transistor respectively connected at the base electrode of said second transistor and at said common terminal; diode means being connected between the base electrode of said third transistor and an interconnection of the base electrodes of said first and second transistor and being poled for conducting in forward direction the base current of said third transistor.

8. A current mirror as set forth in claim 5 wherein said means for limiting the potential excursion at the base electrode of said second transistor includes: a third transistor of a second conductivity type complementary to said first conductivity type, having base and emitter and collector electrodes and having a base-emitter junction, the emitter and collector electrodes of said third transistor respectively connected at the base electrode of said second transistor and at said common terminal; and diode means being connected between the base electrode of said third transistor and said common terminal and being poled for conducting in forward direction the base current of said third transistor.

* * * * *